(12) United States Patent
Anholt

(10) Patent No.: US 8,595,602 B2
(45) Date of Patent: Nov. 26, 2013

(54) CONFIGURABLE ENCODER FOR CYCLIC ERROR CORRECTION CODES

(71) Applicant: Apple Inc., Cupertino, CA (US)

(72) Inventor: Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/920,157

(22) Filed: Jun. 18, 2013

(65) Prior Publication Data

US 2013/0272356 A1    Oct. 17, 2013

Related U.S. Application Data

(63) Continuation of application No. 12/616,151, filed on Nov. 11, 2009, now Pat. No. 8,484,541.

(60) Provisional application No. 61/114,473, filed on Nov. 14, 2008.

(51) Int. Cl.
*H03M 13/00* (2006.01)

(52) U.S. Cl.
USPC ......................................................... 714/781

(58) Field of Classification Search
USPC ......................................................... 714/781
See application file for complete search history.

(56) References Cited

U.S. PATENT DOCUMENTS

| 5,570,378 | A  | * | 10/1996 | Inoue et al. ................... 714/785 |
| 6,058,500 | A  | * | 5/2000  | DesJardins et al. ........... 714/781 |
| 6,219,815 | B1 | * | 4/2001  | DesJardins et al. ........... 714/781 |
| 6,263,471 | B1 | * | 7/2001  | Huang .......................... 714/784 |
| 2004/0002364 | A1 | * | 1/2004 | Trikkonen et al. .......... 455/562.1 |

* cited by examiner

*Primary Examiner* — Charles Ehne
(74) *Attorney, Agent, or Firm* — Meyertons, Hood, Kivlin, Kowert & Goetzel, P.C.

(57) ABSTRACT

Apparatus for encoding includes a first processing stage, which is configured to filter input data with a first set of coefficients belonging to a first generator polynomial representing a first ECC, to produce a first output. A second processing stage is configured to filter the first output using a second set of coefficients belonging to a quotient polynomial, which is defined as a quotient of a second generator polynomial, representing a second ECC, divided by the first generator polynomial, to produce a second output. Ancillary circuitry has first and second operational modes and is coupled to the first and second processing stages so as to generate a first redundancy output corresponding to the first ECC based on the first output when operating in the first mode, and to generate a second redundancy output corresponding to the second ECC based on the second output when operating in the second mode.

20 Claims, 3 Drawing Sheets

CONFIGURABLE ENCODER FOR CYCLIC ERROR CORRECTION CODES

CROSS-REFERENCE TO RELATED APPLICATIONS

This application is a continuation of U.S. patent application Ser. No. 12/616,151, filed Nov. 11, 2009, which claims the benefit of U.S. Provisional Patent Application 61/114,473, filed Nov. 14, 2008, whose disclosure is incorporated herein by reference.

FIELD OF THE INVENTION

The present invention relates generally to error correction coding, and particularly to methods and systems for encoding data with cyclic error correction codes.

BACKGROUND OF THE INVENTION

Error Correction Codes (ECC) are used in a variety of applications, such as in various digital communication and data storage applications. Some ECC types, referred to as cyclic codes, can be represented by generator polynomials defined over a Galois field. Commonly-used examples of cyclic codes are Bose-Chaudhuri-Hocquenghem (BCH) codes and Reed-Solomon (RS) codes. Encoders of cyclic codes are often based on polynomial division. Several example encoder configurations are described by Lin and Costello in "Error Control Coding," Prentice Hall, second edition, June, 2004, chapter 5, pages 146-149, and by Blahut in "Algebraic Codes for Data Transmission," Cambridge University Press, 2004, chapter 8, pages 228-237, which are incorporated herein by reference.

In some applications of error correction coding, it is desirable that the encoder be configurable, i.e., be able to encode data with one of multiple different codes. Several types of configurable ECC encoders are described in the patent literature. For example, U.S. Pat. No. 7,478,310, whose disclosure is incorporated herein by reference, describes a programmable error correcting device. The device includes a controller, which receives information about a length of a codeword, an error correcting capacity, whether or not a shortened codeword mode is supported and a total byte number of burst data, and outputs a control signal. A preprocessor divides input information data by a length of information byte in a codeword and outputs the divided input information data in response to the control signal. A coder decides on a structure for encoding according to the control signal, and performs error correcting encoding on information data provided by the preprocessor according to the decided structure.

U.S. Pat. No. 6,385,751, whose disclosure is incorporated herein by reference, describes a programmable, reconfigurable Reed-Solomon encoder/decoder. The Galois Field order, the primitive polynomial and the number of symbols for each codeword are settable via writable registers. The decoder and encoder parameters are separately specified and the decoder and encoder can run simultaneously and independently.

U.S. Patent Application Publication 2009/0077449, whose disclosure is incorporated herein by reference, describes an encoder and a syndrome computer for cyclic codes, which process M codeword symbols per cycle where M is greater than or equal to one. The encoder and syndrome computer optionally further provide the configurability of a different M value for each cycle and/or the configurability of a different cyclic code for each codeword.

U.S. Pat. No. 6,353,909, whose disclosure is incorporated herein by reference, describes a configurable Reed-Solomon encoder. The encoder comprises a multiplexed multiplier-accumulator, a parallel latch bank operatively coupled to the multiplexed multiplier-accumulator, a data/parity multiplexer coupled to the parallel latch bank, and an encoder controller operatively coupled to, and controlling the operation of, the multiplexed multiplier-accumulator, the parallel latch bank, and the data/parity multiplexer.

U.S. Pat. No. 6,631,488, whose disclosure is incorporated herein by reference, describes a configurable error detection and correction engine having a specialized instruction set tailored for error detection and correction tasks. The engine has a plurality of functional building blocks (e.g., a configurable convolutional encoding functional block, a convolutional configurable decoding functional block, and a configurable cyclic redundancy check (CRC) functional block) that can be programmed or configured.

SUMMARY OF THE INVENTION

An embodiment of the present invention provides apparatus for encoding, including:

a first processing stage, which is configured to filter input data with a first set of coefficients belonging to a first generator polynomial representing a first Error Correction Code (ECC), so as to produce a first output;

a second processing stage, which is configured to filter the first output using a second set of the coefficients belonging to a quotient polynomial, which is defined as a quotient of a second generator polynomial, representing a second ECC, divided by the first generator polynomial, so as to produce a second output; and ancillary circuitry, which has first and second operational modes and is coupled to the first and second processing stages so as to generate a first redundancy output corresponding to the first ECC based on the first output when operating in the first operational mode, and to generate a second redundancy output corresponding to the second ECC based on the second output when operating in the second operational mode.

In some embodiments, the ancillary circuitry is coupled to modify at least one of the coefficients. Additionally or alternatively, at least one of the coefficients is fixed. In an embodiment, the ancillary circuitry is coupled to modify one of the first and second sets of the coefficients, and the other of the first and second sets is fixed. In a disclosed embodiment, the ancillary circuitry is coupled to construct a first code word of the first ECC including the input data and the first redundancy output when operating in the first operational mode, and to construct a second code word of the second ECC including the input data and the second redundancy output when operating in the second operational mode. In another embodiment, the first redundancy output includes a first remainder of dividing a data polynomial representing the input data by the first generator polynomial, and the second redundancy output includes a second remainder of dividing the data polynomial by the second generator polynomial.

In yet another embodiment, the ancillary circuitry is coupled to generate the first redundancy output by calculating a bit-wise Exclusive-Or (XOR) between the input data and the first output, and to generate the second redundancy output by calculating the bit-wise XOR between the input data and the second output. In still another embodiment, the ancillary circuitry is coupled to receive a request to encode the input data with one of the first and second ECCs, and to select one of the first and second operational modes responsively to the request.

In some embodiments, the apparatus includes a transmitter, which is configured to transmit the input data, after encoding with the first or second ECC, over a communication channel to a receiver. In alternative embodiments, the apparatus includes data storage circuitry, which is configured to store the input data, after encoding with the first or second ECC, in a memory device.

In some embodiments, the first and second ECCs include cyclic codes. In an embodiment, the first ECC includes a first Bose-Chaudhuri-Hocquenghem (BCH) code having a first maximum number of correctable errors, and the second ECC comprises a second BCH code having a second maximum number of correctable errors, larger than the first number. In a disclosed embodiment, the first processing stage is coupled to accept and process multiple bits of the input data in each clock cycle, and the second processing stage is coupled to accept and process at least two bits of the first output in each clock cycle. In an embodiment, the first processing stage includes multiple feed-forward paths, which filter the input data with respective shifted sets of the coefficients of the first generator polynomial to produce respective multiple feed-forward outputs, and the ancillary circuitry is coupled to process the multiple feed-forward outputs so as to generate the first and second redundancy outputs.

There is additionally provided, in accordance with an embodiment of the present invention, a method for encoding, including:

using a first processing stage, filtering input data with a first set of coefficients belonging to a first generator polynomial representing a first Error Correction Code (ECC), so as to produce a first output;

using a second processing stage, filtering the first output using a second set of the coefficients belonging to a quotient polynomial, which is defined as a quotient of a second generator polynomial, representing a second ECC, divided by the first generator polynomial, so as to produce a second output;

when operating in a first operational mode, generating a first redundancy output corresponding to the first ECC based on the first output; and when operating in a second operational mode, generating a second redundancy output corresponding to the second ECC based on the second output.

The present invention will be more fully understood from the following detailed description of the embodiments thereof, taken together with the drawings in which:

DETAILED DESCRIPTION OF EMBODIMENTS

Overview

Figure 1:
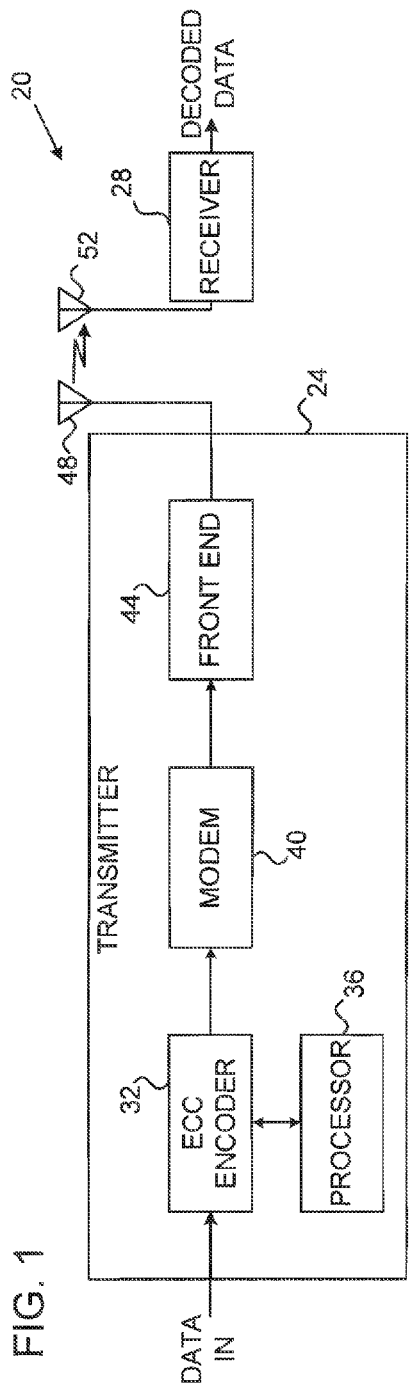
FIG. 1 is a block diagram that schematically illustrates a communication system that uses Error Correction Coding (ECC), in accordance with an embodiment of the present invention.

In some Error Correction Coding (ECC) applications, data is encoded with one of multiple different codes. In storage applications, for example, a memory controller may be designed to operate with different types of memory devices having different page sizes, and therefore should support multiple code word sizes. In communication applications, different codes may be used to match varying channel conditions. In both communication and storage applications, it is sometimes desirable to encode different types of data, such as management data and user data, with different codes.

Embodiments of the present invention that are described hereinbelow provide improved ECC encoding schemes, which are configurable to support multiple different codes. The disclosed encoder configurations are particularly applicable to cyclic codes, such as Bose-Chaudhuri-Hocquenghem (BCH) and Reed-Solomon (RS) codes, in which the code can be represented by a generator polynomial defined over a finite field.

In some cases, the generator polynomial of a given cyclic code can be expressed as the generator polynomial of another code in the same family, multiplied by a certain polynomial. BCH codes, for example, exhibit this relationship. The configurable encoding schemes described herein exploit this property of cyclic codes, and thus achieve a high degree of hardware commonality and efficiency.

In some embodiments, an ECC encoder is configurable to operate in at least two operational modes. In the first mode, the encoder encodes input data with a first code that is represented by a first generator polynomial. In the second mode, the encoder encodes the input data with a second code represented by a second generator polynomial, which can be expressed as the first generator polynomial multiplied by some quotient polynomial. (In other words, the quotient polynomial is defined as the quotient of the second generator polynomial divided by the first generator polynomial.) The encoder comprises two processing stages connected in cascade, along with ancillary circuitry. The first processing stage filters the input data by the coefficients of the first generator polynomial, and the second processing stage filters the output of the first stage by the coefficients of the quotient polynomial.

When operating in the first mode, the ancillary circuitry generates redundancy bits of the first code (i.e., encodes the input data with the first code) based on the output of the first processing stage. The second processing stage is typically idle in the first mode. When operating in the second mode, the ancillary circuitry generates redundancy bits of the second code (i.e., encodes the input data with the first code) based on the output of the second processing stage.

The configurable encoder schemes described herein can be generalized to any desired number of cascaded processing stages. Each processing stage divides the data at its input by a certain polynomial, which may be a factor of a higher-rank generator polynomial. When requested to perform encoding by a given code, the ancillary circuitry selectively activates and de-activates the processing stages, depending on the generator polynomial of the requested code. Any of the processing stages may comprise fixed coefficients or programmable coefficients. In some embodiments, the encoder comprises parallel circuitry that processes multiple input data bits in each clock cycle, so as to improve encoding speed.

Since the disclosed encoder schemes use the commonality between the generator polynomials of different codes, unnecessary hardware duplication is eliminated. As a result, the size, cost and power consumption of the encoder are reduced.

System Description

Figure 2:
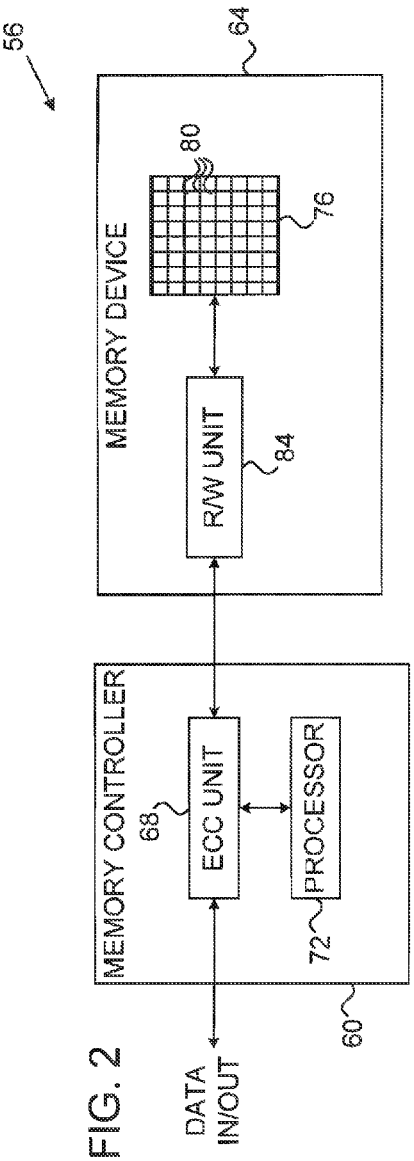
FIG. 2 is a block diagram that schematically illustrates a memory system that uses ECC, in accordance with an embodiment of the present invention.

Embodiments of the present invention provide improved methods and systems for encoding data with cyclic Error Correction Codes (ECC), such as Bose-Chaudhuri-Hocquenghem (BCH) or Reed-Solomon (RS) codes. The disclosed techniques can be used in a wide variety of systems and applications in which ECC is deployed, such as in various communication and data storage systems. FIGS. 1 and 2 below illustrate two example applications.

FIG. 1 is a block diagram that schematically illustrates a wireless communication system 20 that uses error correction coding, in accordance with an embodiment of the present invention. System 20 comprises a transmitter 24, which transmits data to a receiver 28. The transmitter comprises an ECC encoder 32, which accepts input data and encodes the data with a certain ECC. ECC encoder 32 is configurable to support multiple different codes, using techniques that are explained in detail below. ECC encoder 32 is controlled by a processor 36. In particular, processor 36 typically instructs the encoder which code to use when encoding given data for transmission.

The transmitter comprises a modem 40, which modulates the encoded data in accordance with a certain modulation scheme. A front end 44 converts the modulated digital signal to an analog signal, up-converts the analog signal to a suitable Radio frequency (RF), and transmits the RF signal toward receiver 28 using a transmit antenna 48. In receiver 28, a receive antenna 52 receives the RF signal. The receiver typically down-converts and digitizes the RF signal. The receiver demodulates the signal carrying the ECC-encoded data, and decodes the ECC so as to reconstruct the transmitted data. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

FIG. 2 is a block diagram that schematically illustrates a data storage system 56 that employs error correction coding, in accordance with an alternative embodiment of the present invention. System 56 comprises a memory controller 60, which stores data in a memory device 64. The memory device comprises an array 76 comprising multiple memory cells 80. Array 76 may comprise any suitable type of volatile or non-volatile memory, such as, for example, Random Access Memory (RAM) or Flash memory. Alternatively, device 64 may comprise a magnetic storage device such as a Hard Disk Drive (HDD), or any other suitable storage medium. System 56 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 64 comprises a Read/Write (R/W) unit 84, which writes data values into memory cells 80 and reads data values from the memory cells. Memory controller 60 comprises an ECC unit 68, which encodes the data for storage with a certain ECC, and decodes the ECC of data that is retrieved from the memory cells. ECC unit is configurable to support multiple different codes, using techniques that are explained in detail below. The ECC unit is controlled by a processor 72. In particular, processor 72 typically instructs the ECC unit which code to use when encoding given data for storage.

The ECC used in systems 20 and 56 may comprise, for example, a suitable BCH or RS code, as well as various other types of cyclic ECC. Processors 36 and 72, ECC encoder 32 and ECC unit 68 can be implemented in software, in hardware or using a combination of hardware and software elements. In some embodiments, processors 36 and 72 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory.

The ECC encoder configurations described hereinbelow can be used in communication systems such as system 20, as well as in data storage systems such as system 56. The description that follows applies to both communication applications and to storage applications, and refers generally to an ECC encoder and a processor. Any reference to the ECC encoder applies to encoder 32 of system 20, as well as to the encoder functionality of unit 68 in system 56. Any reference to the processor applies to processor 36 of system 20, as well as to processor 72 in system 56. Alternatively, the methods described herein can be carried out by any suitable element in any suitable system that involves ECC encoding.

Configurable Encoder Schemes

A typical ECC encoder accepts k data symbols for encoding and produces an n-symbol code word, n>k. The description that follows refers to binary codes, in which the encoder accepts k input data bits and produces an n-bit code word. Nevertheless, the disclosed techniques can be used with non-binary codes, as well. The description that follows refers to systematic codes. In a systematic code, the code word includes the original k data bits, plus n–k redundancy (parity) bits.

Cyclic codes and their and their encoding and decoding can be represented using polynomial operations over a finite field, typically a Galois Field (GF). A given cyclic code can be represented by a generator polynomial whose rank is n–k, i.e., the redundancy size. Code words can be represented as polynomials whose rank is n, in which the data bits correspond to the polynomial coefficients. All code words are represented by polynomials that are multiples of the generator polynomial of the code. In a systematic cyclic code, each code word can be expressed as a sum of a systematic polynomial (a polynomial of rank n, in which the lower n–k coefficients are zero and the higher k coefficients comprise the data bits), plus a redundancy polynomial of rank n–k, whose coefficients comprise the redundancy bits.

In other words, the redundancy polynomial can be produced by dividing the systematic polynomial by the generator polynomial of the code. Thus, encoding data with a systematic cyclic code can be performed by (1) dividing the polynomial representing the input data by the generator polynomial, (2) taking the remainder of the division operation to produce the redundancy bits (or a negation of the redundancy in some non-binary codes), and (3) constructing a code word comprising the data bits and the redundancy bits. Various hardware configurations for performing such polynomial division and remainder operations are known in the art. Several configurations are described, for example, in the references by Blahut and Lin and Costello, cited above.

In some ECC types, the generator polynomial of a given code is a divisor of the generator polynomial of another code of the same type. In other words, the generator polynomial of one code can be expressed as the generator polynomial of another code of the same type, multiplied by a certain polynomial. BCH codes, for example, exhibit this property.

Consider, for example, two codes whose generator polynomials are denoted $g(x)$ and $q(x)$. The coefficients of $q(x)$ are denoted $\{q_0 \ldots q_{n-k}\}$, and the coefficients of $g(x)$ are denoted $\{g_0 \ldots g_{L1}\}$. In the present example, $g(x)$ divides $q(x)$, i.e., $q(x)$ can be expressed as a multiple of $g(x)$ by some polynomial $h(x)$: $q(x)=g(x) \cdot h(x)$. The coefficients of $h(x)$ are denoted $\{h_0 \ldots h_{L2}\}$.

In some embodiments, a configurable encoder supports two operational modes, one mode for encoding input data with the code expressed by $g(x)$, and the other mode for encoding the input data with the code expressed by $q(x)$. The encoder uses the commonality between the two generator polynomials to avoid hardware duplication.

Figure 3:
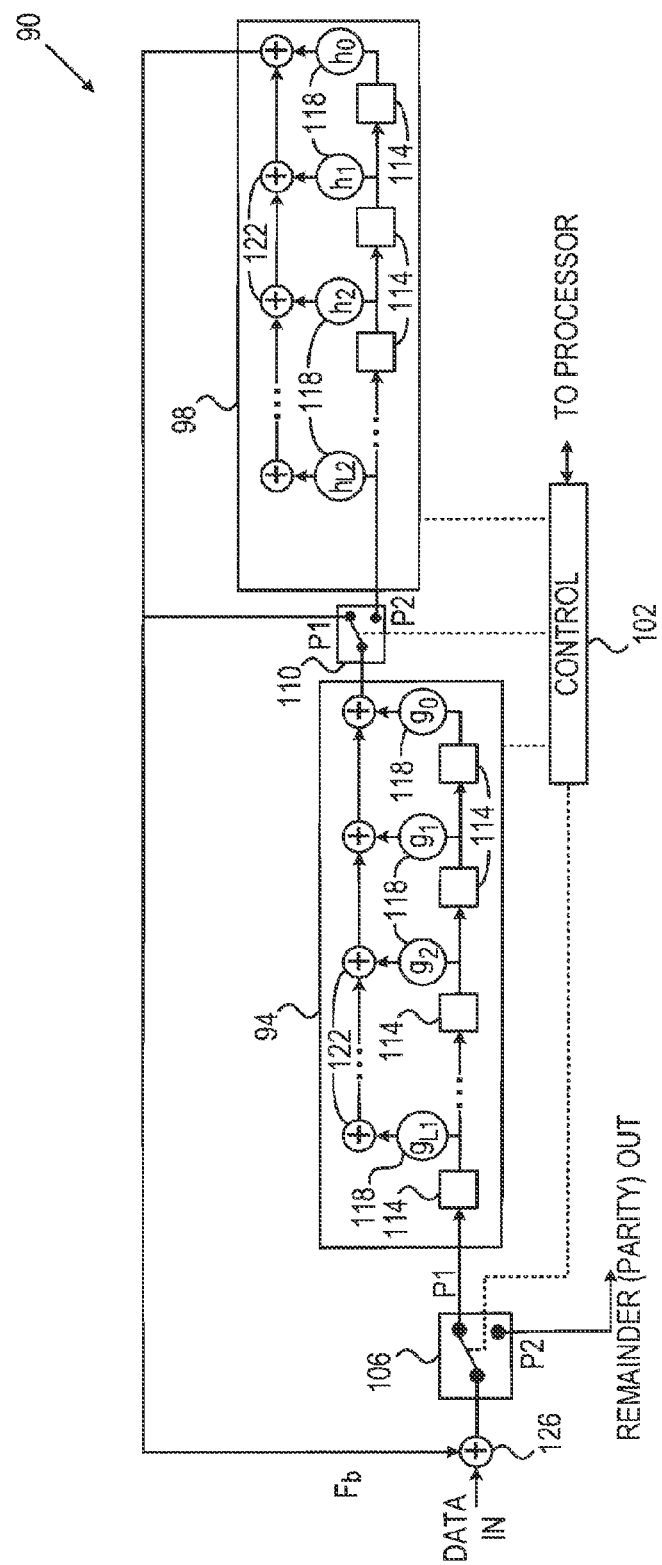
FIG. 3 is a block diagram that schematically illustrates an ECC encoder, in accordance with an embodiment of the present invention.

FIG. 3 is a block diagram that schematically illustrates an ECC encoder 90, in accordance with an embodiment of the present invention. ECC encoder 90 can be used, for example, to implement encoder 32 of system 20 in FIG. 1 above, or to implement the encoding functionality of ECC unit 68 in system 56 of FIG. 2 above. Encoder 90 is controlled by a processor (e.g., processor 36 of FIG. 1 or processor 72 of FIG. 2). The processor may instruct the encoder to operate in one of two modes—for encoding input data with the code represented by $g(x)$ or by the code represented by $q(x)$.

Encoder 90 comprises two processing stages 94 and 98, and a control unit 102. Control unit 102 configures the inputs and outputs of stages 94 and 98 using switches 106 and 110, as will be explained below. In addition, unit 102 may load polynomial coefficients into stage 94, 98 or both.

When switch 106 is at position P1, processing stage 94 filters the input data using the coefficients of $g(x)$. Stage 94 comprises a shift register having multiple register stages 114, coefficient multipliers 118 (which are configured with the coefficients $\{g_0 \ldots g_{L1}\}$), and Exclusive-Or (XOR) units 122. The arithmetic operations performed by these elements (e.g., multiplication and XOR) are over the Galois field applicable to the code. The filtering result is provided as the output of unit 94. In non-binary codes, units 122 perform addition in the Galois field in question, rather than XOR.)

When switch 110 is at position P2, the output of stage 94 is provided to stage 98 as input. Processing stage 98 filters the output of stage 94 using the coefficients of the quotient polynomial $h(x)$. Stage 98 comprises a shift register having multiple register stages 114, coefficient multipliers 118 (which are configured with the coefficients $\{h_0 \ldots h_{L2}\}$), and XOR units 122. Similarly to stage 94, the arithmetic operations performed by these elements are over the Galois field in question. The filtering result is provided as the output of unit 98.

Control unit 102 operates the two processing stages in the two operational modes described above by controlling switches 106 and 110. Typically although not necessarily, unit 102 selects the operational mode in response to a request from the processor.

When operating in the first operational mode (which encodes the input data with the code represented by $g(x)$), unit 102 sets switch 110 to position P1. In this mode, processing stage 98 is not used and may be de-activated to reduce power consumption. The output of stage 94 is fed back to the encoder's input. A XOR unit 126 performs bit-wise XOR between the output of stage 94 and the input data. Initially, switch 106 is set to position P1, so that the input data is provided serially to shift register stages 114 of stage 94. During this process, multipliers 118 multiply the shifting data bits by the appropriate coefficients of $g(x)$, and XOR units 122 perform a XOR of the multiplier outputs. The XOR result is provided as output of stage 94.

After L1 bits of the input data are shifted into the shift register of stage 94, control unit 102 sets switch 106 to position P2. As noted above, switch 110 is constantly set to position P1 when operating in the first operational mode. Therefore, once switch 106 is set to position P2, the output of XOR unit 126 at the encoder input is provided serially as the encoder output. Note that multipliers 118 and XOR units 122 continue to process the shifting data bits during this process.

It can be shown that the filtering and feedback process described above produces the redundancy bits of the first code (i.e., the remainder of the division of the input data by generator polynomial $g(x)$) at the encoder output. Typically, the encoder then constructs a code word of the first code, which comprises the original input data bits and the redundancy bits.

When operating in the second operational mode (which encodes the input data with the code represented by $q(x)=g(x) \cdot h(x)$), control unit 102 sets switch 110 to position P2. In this setting, the output of processing stage 94 is provided as input to processing stage 98. Initially, unit 102 sets switch 106 to position P1, causing the input data bits to enter stage 94. The input data bits are filtered by stage 94 (using the coefficients of $g(x)$), and then by stage 98 (using the coefficients of $h(x)$). The output of stage 98 is fed back to XOR unit 126, unit 126 performs bit-wise XOR between this feedback and the input data, and the XOR result is provided as input to stage 94.

After L1+L2 input data bits enter the encoder, control unit 102 sets switch 106 to position P2. As noted above, switch 110 is constantly set to position P2 in the second operational mode. From this point, the output of switch 106 is provided as output. It can be shown that the cascaded filtering process performed by stages 94 and 98 produces the redundancy bits of the second code (i.e., the remainder of the division of the input data by generator polynomial $q(x)$) at the encoder output. Typically, the encoder then constructs a code word of the second code, which comprises the original input data bits and the redundancy bits.

As can be appreciated, the encoder of FIG. 3 supports both the code represented by $g(x)$ and the code represented by $q(x)$, with a hardware size that is comparable to an encoder that supports only the code represented by $q(x)$. In other words, by using the commonality between the generator polynomials of the two codes, the disclosed configuration enables support of multiple codes with only a marginal increase in hardware size.

The elements of encoder 90 other than stages 94 and (i.e., control unit 102, switches 106 and 110, XOR unit 126 and the interconnections between these elements) are collectively referred to herein as ancillary circuitry, which controls the processing stages and manipulates their inputs and outputs so as to encode the input data with the desired code.

The configuration of encoder 90 in FIG. 3 is an example configuration, which is chosen purely for the sake of conceptual clarity. In alternative embodiments, any other suitable configuration can also be used. The different elements of encoder 90 may be implemented using any suitable hardware, such as in an Application-Specific Integrated Circuit (ASIC) or Field-Programmable Gate Array (FPGA). In some embodiments, some elements of the encoder (e.g., control unit 102) can be implemented using software, or using a combination of hardware and software elements.

In alternative embodiments, the encoder may comprise more than two cascaded processing stages, each filtering its respective input with a certain polynomial. Thus, for example, if N codes are represented by generator polynomials $g_1(x) \ldots g_N(x)$, such that $g_2(x)=g_1(x) \cdot h_1(x)$, $g_3(x)=g_2(x) \cdot h_2(x)$, $g_4(x)=g_3(x) \cdot h_3(x) \ldots$ then a configurable encoder may comprise cascaded processing stages that filter their respective inputs using the coefficients of $g_1(x)$, $h_1(x)$, $h_2(x)$, $h_3(x) \ldots$.

The coefficients used by any of the processing stages may be fixed (e.g., hardwired) or programmable by unit 102. When a given processing stage uses fixed coefficients, multipliers 118 may comprise fixed rather than programmable multipliers. In addition, control and interface hardware in a fixed-coefficient stage are considerably simpler. As a result, the hardware complexity and size of a fixed-coefficient stage are considerably smaller in comparison with programmable-coefficient stages. In some embodiments, the encoder may comprise a hybrid configuration of one or more fixed-coefficient stages and one or more programmable-coefficient stages. In particular, an encoder may comprise a single programmable-coefficient stage and multiple fixed-coefficient stages. The order of the fixed- and programmable-coefficient stages in the cascade can be set to any desired order.

Consider, for example, a set of codes represented by a set of generator polynomials, such that each polynomial divides the higher-rank polynomials in the set. A configurable dual-stage encoder can be configured to encode all of these codes by implementing one stage as a fixed-coefficient stage and the other stage as a programmable-coefficient stage. Let $r_{max}$ denote the rank of the highest-rank generator polynomial in the set. Let $P_{mid}(x)$ denote one of the polynomials in the set, whose rank is equal or close to $r_{max}/2$. The coefficients of one stage may be fixed with the $r_{max}/2$ coefficient values of $P_{mid}(x)$. The coefficients of the other stage are programmable.

In order to encode the input data with a polynomial $R(x)$ from the set whose rank $r<r_{max}/2$, the programmable stage are programmed with the coefficients of this polynomial, and the fixed-coefficient stage is bypassed (or reduced to a single coefficient). When requested to encode the input data with a polynomial $R(x)$ from the set whose rank $r \geq r_{max}/2$, it is known that $P_{mid}(x)$ divides this polynomial. Thus, the fixed-coefficient stage is enabled (so as to filter the input data with $P_{mid}(x)$) and the programmable-coefficient stage is programmed with the coefficients of $f(x)$, which is given by $R(x)=P_{mid}(x) \cdot f(x)$. Using this technique, the encoder supports a range of codes using only half the number of programmable coefficients, in comparison with a single-stage configurable encoder.

In some embodiments, the generator polynomials comprise binary polynomials, i.e., their coefficients comprise binary values. In these embodiments, multipliers 118 can be implemented using switches or multiplexers. In a fixed-coefficient stage of a binary polynomial, the multipliers can be implemented using short- and open-circuit connections.

Figure 4:
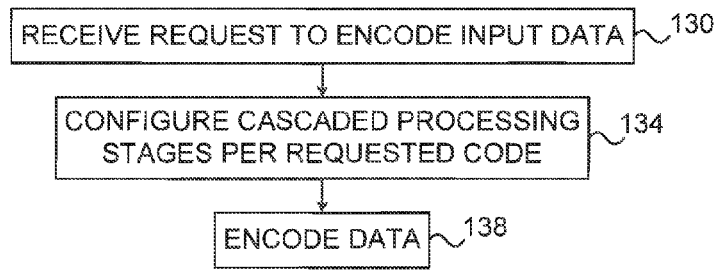
FIG. 4 is a flow chart that schematically illustrates a method for ECC encoding, in accordance with an embodiment of the present invention.

FIG. 4 is a flow chart that schematically illustrates a method for ECC encoding, in accordance with an embodiment of the present invention. The method begins with encoder 90 receiving a request from the processor to encode the input data with one of the supported codes, at a requesting step 130. Control unit 102 of encoder 90 configures the encoder elements according to the requested code, at a configuration step 134. As explained above, the control unit may load coefficient values into one or both processing stages, and control switch 110, based on the requested code. Encoder 90 then encodes the input data using the requested code, at an encoding step 138.

When using BCH codes, for example, a given BCH code is specified to correct up to T errors per code word. The generator polynomial of a code that corrects up to T errors divides the generator polynomial of the code that corrects up to T+1 errors. Consider, for example, an application that is required to correct up to 59 errors per code word in a BCH code over Galois Field $GF(2^m)$. In the present example, the rank of the generator polynomial for this code is 944. A configurable dual-stage encoder can be implemented as follows: The first processing stage comprises a fixed-coefficient stage that is configured with 480 coefficients of a generator polynomials of a BCH code that corrects up to 30 errors. The second processing stage comprises a programmable-coefficient stage, having 944−480=464 coefficients. For T<30 (i.e., for BCH codes that correct up to 30 errors per code word), only the programmable-coefficient stage is enabled and the fixed-coefficient stage is bypassed. For T≥30, both stages are active and cascaded. Thus, any T≤59 is supported.

Filtering Multiple Input Data Bits Per Clock Cycle

In the encoder configurations described above, the encoder processes one input data bit in each clock cycle. In alternative embodiments, the encoder comprises additional circuitry that allows parallel processing of D≥2 bits per clock cycle, thus improving the encoder's throughput and encoding speed. The description that follows refers to a single processing stage, which carries out a division by a given polynomial. The technique described below can be used to implement a configurable encoder having multiple cascaded processing stages, each stage processing D bits per clock cycle.

The number of register stages 114 in the processing stage's shift register is denoted r. In the single-bit-per-clock case (e.g., in FIG. 3 above), a single bit enters the shift register in each clock cycle, the shift register content is shifted to the right, and the output of the last register stage is discarded. As can be seen in FIG. 3, the bit that enters the shift register at a given clock cycle is produced by XOR'ing the current input data bit with the feedback from the stage's output. In other words, the bit that enters the shift register at a given clock cycle depends on the current input data bit, and on the feedback from the stage's output (i.e., on the values of the r shift register stages).

The description that follows generalizes this scheme to parallel computation of D bits per clock cycle. The D bits of input data processed in a given clock cycle are denoted inp[0] . . . inp[D−1]. The D bits entering the shift register in a given clock cycle (which depend on the input data bits and on the feedback from the stage's output) are denoted DL[0] . . . DL[D−1].

Figure 5:
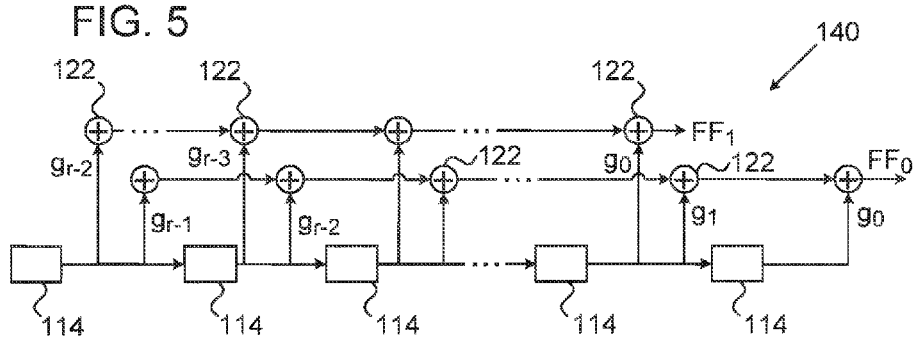
FIG. 5 is a block diagram that schematically illustrates parallel processing circuitry used in an ECC encoder, in accordance with an embodiment of the present invention.

FIG. 5 is a block diagram that schematically illustrates parallel processing circuitry 140 used in an ECC encoder, in accordance with an embodiment of the present invention. Unlike the one-bit-per-cycle implementation of FIG. 3, circuitry 140 of FIG. 5 comprises D sets of coefficient multipliers 118 and XOR units 122. Each set of multipliers and XOR units is referred to as a feed-forward path. The outputs of the D feed-forward paths are denoted $FF_0 \ldots FF_{D-1}$. (FIG. 5 shows only the first two feed-forward paths for the sake of simplicity.)

The first feed-forward output $FF_0$ can be used as-is for computing the feedback, since all D bit values used in its computation are present in the shift register. The second feed-forward output $FF_1$, on the other hand, is computed using only D-1 bit values. One bit value is unknown, since it should depend on a feedback value from the previous bit that is not yet present in the shift register. The remaining feed-forward outputs are similarly computed based on the bit values that are currently present in the shift register, and have some missing feedback values. In some embodiments, the encoder comprises parallel computation logic, which compensates for the missing feedback values in the feed-forward outputs.

Figure 6:
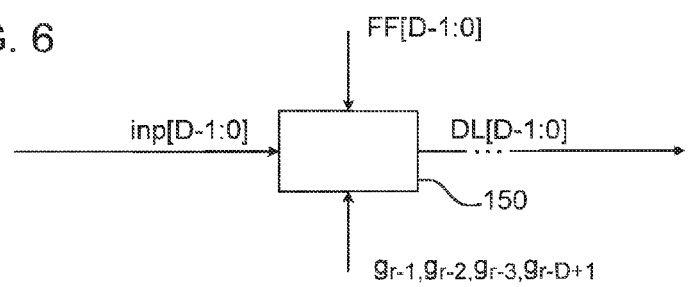
FIG. 6 is a block diagram that schematically illustrates parallel computation logic used in an ECC encoder, in accordance with an embodiment of the present invention.

FIG. 6 is a block diagram that schematically illustrates a parallel computation unit 150 used in an ECC encoder, in accordance with an embodiment of the present invention. Unit 150 can be used in conjunction with the parallel configuration of FIG. 5 above. In each clock cycle, unit 150 computes D bits that enter the shift register based on (1) D input data bits, (2) D feed-forward outputs provided by circuitry 140 of FIG. 5, and (3) the generator polynomial coefficients $g_{r-1}, \ldots, g_{r-D+1}$. In other words, the unit of FIG. 6 computes DL[0 ... D-1] as a function of inp[0] ... inp[D-1] and $FF_0 \ldots FF_{D-1}$. Typically, unit 150 replaces XOR unit 126 of FIG. 3 above when implementing a D bits/cycle encoder. Thus, the configurations of FIGS. 5 and 6 enable encoding of D input data bits per clock cycle.

The following equations further detail the operation of parallel computation unit 150. In a given clock cycle, the first bit entering the shift register is given by DL[0]=inp[0]^$FF_0$, wherein ^ denotes a XOR operation. The second bit is given by DL[1]=inp[1]^$FF_1$^(DL[0]&$g_{r-1}$), wherein & denotes a logical AND operation. Thus, DL[1] is computed based on the first feed-forward output, and a compensation term that compensates for the feedback value missing in the shift register. The third bit entering the shift register, DL[2], is computed based on the third feed-forward output and on the two previous bits DL[0] and DL[1]. DL[2] is given by DL[2]=inp[2]^$FF_2$^(DL[0]&$g_{r-2}$)^(DL[1]&$g_{r-1}$). The remaining bits (DL[3] ... DL[D-1]) are computed in a similar manner. Unit 150 computes DL[0] ... DL[D-1] in each clock cycle using the above equations, and provides the computed values to the shift register of the first processing stage of the encoder.

Although the embodiments described herein mainly address encoding with systematic codes, the methods and systems described herein can also be used, mutatis mutandis, for encoding with non-systematic codes using polynomial multiplication. Consider, for example, a generator polynomial of a first non-systematic code, which can be represented as the generator polynomial of a second non-systematic code multiplied by some quotient polynomial. A configurable encoder may comprise two cascaded processing stages, the first stage multiplying by the generator polynomial of the second code and the second stage multiplying by the quotient polynomial. The inputs and outputs of the two stages can be manipulated, as described above, so that the encoder is configurable to encode input data using the first or the second code.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

What is claimed is:

1. An mobile communication device, comprising:
an Error Correction Code (ECC) encoder configured to receive input data, and encode the received input data with an ECC;
a modem coupled to the ECC encoder, wherein the modem is configured to modulate the encoded data; and
a front-end unit coupled to the modem, wherein the front-end unit is configured to:
convert the modulate encoded data into an analog signal;
convert the analog signal into a radio frequency (RF) signal; and
transmit the RF signal to a receiver using an antenna;
wherein to encode the received input data, the ECC encoder is further configured to:
filter the received input data using a first set of coefficients to produce a first output; and
filter the first output using a second set of coefficients.

2. The apparatus of claim 1, wherein the first set of coefficients belong to a first generator polynomial representing a first ECC code.

3. The apparatus of claim 2, wherein the second set of coefficients belong to a quotient polynomial, wherein the quotient polynomial is a second generator polynomial representing a second ECC code divided by the first generator polynomial.

4. The apparatus of claim 2, wherein the ECC encoder is further configured to modify at least one of the coefficients.

5. The apparatus of claim 2, wherein the ECC encoder is further configured to generate a first redundancy output by calculating a bit-wise exclusive-OR (XOR) between the input data and the first generator polynomial.

6. The apparatus of claim 5, wherein to encode the input data, the ECC encoded is further configured to generate a second redundancy output by calculating a bit-wise XOR between the input data and the second output.

7. The apparatus of claim 6, wherein to encode the input data, the ECC encoder is further configured to select the first redundancy output of the second redundancy output dependent upon an operational mode.

8. A method, comprising:
receiving input data;
filtering the received input data using a first set of coefficients to produce a first output;
filtering the first output using a second set of coefficients;
generating an encoded output dependent upon the first output and the second output;
modulating the encoded output;
converting the modulated selected output into an analog signal;
converting the analog signal into a radio frequency (RF) signal; and
transmitting the RF signal to a receiver using an antenna.

9. The method of claim 8, wherein the first set of coefficients belong to a first generator polynomial representing a first ECC code and the second set of coefficients belong to a quotient polynomial, wherein the quotient polynomial is a second generator polynomial representing a second ECC code divided by the first generator polynomial.

10. The method of claim 9, wherein generating the encoded output comprises, generating a first redundancy output by calculating a bit-wise exclusive-OR (XOR) between the input data and the first generator polynomial.

11. The method of claim 10, wherein generating the encoded output further comprises, generating a second redundancy output by calculating a bit-wise XOR between the input data and the second output.

12. The method of claim 11, wherein generating the encoded output further comprises selecting the first redundancy output or the second redundancy output dependent upon an operational mode.

13. The method of claim 8, further comprising modifying at least one of the first set of coefficients or the second set of coefficients.

14. The method of claim 8, further comprising modifying one of the first and second set of coefficients, wherein the other of the first and second set of coefficients is fixed.

15. A computer-accessible non-transitory storage medium, having program instructions stored therein that, in response to execution by a computer system, cause the computer system to perform operations including:
  receiving input data;
  filtering the received input data using a first set of coefficients to produce a first output;
  filtering the first output using a second set of coefficients;
  generating an encoded output dependent upon the first output and the second output;
  modulating the encoded output;
  converting the modulated selected output into an analog signal;
  converting the analog signal into a radio frequency (RF) signal; and
  transmitting the RF signal to a receiver using an antenna.

16. The computer-accessible non-transitory storage medium of claim 15, wherein to perform operations further includes modifying one of the first and second set of coefficients, wherein the other of the first and second set of coefficients is fixed.

17. The computer-accessible non-transitory storage medium of claim 15, wherein the first set of coefficients belong to a first generator polynomial representing a first ECC code and the second set of coefficients belong to a quotient polynomial, wherein the quotient polynomial is a second generator polynomial representing a second ECC code divided by the first generator polynomial.

18. The computer-accessible non-transitory storage medium of claim 17, wherein the first ECC code has a first maximum number of correctable errors, and the second ECC code has a second maximum number of correctable errors, wherein the second maximum number of correctable errors is larger than the first maximum number of correctable errors.

19. The computer-accessible non-transitory storage medium of claim 15, wherein the first ECC code comprises a first Bose-Chaudhuri-Hocquenghem (BCH) code, and wherein the second ECC code comprises a second BCH code.

20. The computer-accessible non-transitory storage medium of claim 15, wherein generating the encoded output comprises:
  generating a first redundancy output by calculating a bit-wise exclusive-OR (XOR) between the input data and the first generator polynomial;
  generating a second redundancy output by calculating a bit-wise XOR between the input data and the second output; and
  selecting the first redundancy output or the second redundancy output dependent upon an operational mode.

* * * * *